(12) United States Patent
Hirao et al.

(10) Patent No.: US 9,290,861 B2
(45) Date of Patent: Mar. 22, 2016

(54) GROUP 13 NITRIDE CRYSTAL WITH STEPPED SURFACE

(75) Inventors: Takayuki Hirao, Nagoya (JP); Takanao Shimodaira, Nagoya (JP); Katsuhiro Imai, Nagoya (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 716 days.

(21) Appl. No.: 13/496,982

(22) PCT Filed: Oct. 15, 2010

(86) PCT No.: PCT/JP2010/068166
§ 371 (c)(1),
(2), (4) Date: Mar. 19, 2012

(87) PCT Pub. No.: WO2011/046203
PCT Pub. Date: Apr. 21, 2011

(65) Prior Publication Data
US 2012/0175740 A1    Jul. 12, 2012

(30) Foreign Application Priority Data
Oct. 16, 2009 (JP) .................... 2009-239567

(51) Int. Cl.
*C30B 29/40* (2006.01)
*C30B 33/08* (2006.01)
*H01L 21/02* (2006.01)

(52) U.S. Cl.
CPC .............. *C30B 29/406* (2013.01); *C30B 33/08* (2013.01); *H01L 21/0243* (2013.01); *H01L 21/0254* (2013.01); *H01L 21/02389* (2013.01); *H01L 21/02433* (2013.01)

(58) Field of Classification Search
CPC ........ C30B 25/00; C30B 25/02; C30B 25/18; C30B 25/186; C30B 25/20; C30B 19/00; C30B 19/02; C30B 19/12; C30B 9/00; C30B 9/04; C30B 9/08; C30B 9/12; C30B 29/00; C30B 29/10; C30B 29/38; C30B 29/40; C30B 29/403; C30B 29/406
USPC ............ 117/11, 84, 88–90, 94, 97, 101, 106, 117/902, 937, 952; 423/351, 406, 409; 252/518.1, 521.6, 584
See application file for complete search history.

(56) References Cited

U.S. PATENT DOCUMENTS

2007/0209575 A1* 9/2007 Iwai et al. ............. 117/78
2008/0308907 A1* 12/2008 Hirai et al. ............ 257/615

FOREIGN PATENT DOCUMENTS

| CN | 1938457 A | 3/2007 |
| JP | 2001-267692 A | 9/2001 |

(Continued)

OTHER PUBLICATIONS

International Search Report for PCT Patent App. No. PCT/JP2010/068166 (Nov. 22, 2010).

(Continued)

*Primary Examiner* — Kenneth A Bratland, Jr.
(74) *Attorney, Agent, or Firm* — Cermak Nakajima & McGowan LLP; Tomoko Nakajima

(57) ABSTRACT

Regarding a base substrate, a plurality of steps are formed stepwise on the principal surface (c-face). Each step has a height difference of 10 to 40 μm, and an edge is formed parallel to an a-face of a hexagonal crystal of GaN. Meanwhile, the terrace width of each step is set at a predetermined width. The predetermined width is set in such a way that after a GaN crystal is grown on the principal surface of the base substrate, the principal surface is covered up with grain boundaries when the grown GaN crystal is observed from the surface side. The plurality of steps can be formed through, for example, dry etching, sand blasting, lasing, and dicing.

4 Claims, 26 Drawing Sheets

(56) References Cited

FOREIGN PATENT DOCUMENTS

| JP | 2001267692 A | * | 9/2001 |
| JP | 2005-281067 A | | 10/2005 |
| JP | 2006-165070 A | | 6/2006 |
| JP | 2009-051686 A | | 3/2009 |
| JP | 2009-062229 A | | 3/2009 |

OTHER PUBLICATIONS

International Preliminary Report on Patentability for PCT Patent App. No. PCT/JP2010/068166 (May 24, 2012).

* cited by examiner (a)

(b)

(a)

(b)

[Sectional view of a section taken along a line A-A]

(a)

(b)

[Sectional view of a section taken along a line B-B]

(a)

(b)

[Sectional view of a section taken along a line C-C]

GROUP 13 NITRIDE CRYSTAL WITH STEPPED SURFACE

This application is a national phase entry under 35 U.S.C. §371 of PCT Patent Application No. PCT/JP2010/068166, filed on Oct. 15, 2010, which claims priority under 35 U.S.C. §119 to Japanese Patent Application No. 2009-239567, filed Oct. 16, 2009, both of which are incorporated by reference.

TECHNICAL FIELD

The present invention relates to a base substrate, a group 13 nitride crystal, and a method for manufacturing the same.

BACKGROUND ART

In recent years, it has been studied actively to produce semiconductor devices, e.g., a blue LED, a white LED, and a violet semiconductor laser, by using group 13 nitrides, e.g., gallium nitride, and apply the resulting semiconductor devices to various electronic apparatuses. Conventional gallium nitride-based semiconductor devices are produced mainly by a vapor phase method. Concretely, production is performed through heteroepitaxial growth of a gallium nitride thin film on a sapphire substrate or a silicon carbide substrate by, for example, a metal organic vapor phase epitaxy method (MOVPE). In this case, the thermal expansion coefficients and the lattice constants are significantly different between the substrate and the gallium nitride thin film and, therefore, high density dislocations (one type of lattice defects in a crystal) occurs in gallium nitride. Consequently, regarding the vapor phase method, it has been difficult to obtain high-quality gallium nitride having a low dislocation density. Meanwhile, besides the vapor phase method, a liquid phase method has also been developed. A flux method is one of the liquid phase method. In the case of gallium nitride, by using metal sodium as a flux, the temperature and the pressure, which are required for crystal growth of gallium nitride, can be alleviated to about 800° C. and several MPa to several hundred MPa, respectively. Concretely, a nitrogen gas is dissolved into a mixed melt of metal sodium and metal gallium, and gallium nitride becomes supersaturated, so that a crystal grows. As for such a liquid phase method, dislocations do not occur easily as compared with the vapor phase method. Therefore, high-quality gallium nitride having a low dislocation density can be obtained.

Research and development on such a flux method have also been performed actively. For example, Patent Document 1 discloses a method for manufacturing a group 13 nitride crystal for the purpose of reducing the dislocation density. Concretely, in the flux method, a substrate, in which the normal to the principal surface has an inclination angle of 1° or more and 10° or less relative to the <0001> direction of a gallium nitride seed crystal layer, is used as a base substrate containing the gallium nitride seed crystal layer, and during growth of a gallium nitride single crystal on the principal surface of the base substrate, dislocations remaining in the gallium nitride single crystal are propagated in a direction parallel to the {0001} face so as to be discharged to a peripheral portion of the single crystal.

By the way, in FIG. 2 of Patent Document 1, as for the principal surface of the base substrate, a stepwise uneven surface having a plurality of microsteps is exemplified. These microsteps are formed from a plurality of terrace surfaces, which are {0001} faces (c-faces), and a plurality of step surfaces, which are a plurality of {1-100} faces (m-faces), and adjacent terrace surfaces are connected to each other with the step surfaces therebetween. Here, crystal growth in a direction parallel to the terrace surface is predominant to crystal growth in a direction perpendicular to the terrace surface and dislocations are propagated in the direction of crystal growth. Therefore, the dislocations generated during crystal growth are propagated substantially parallel to the terrace surface so as to be discharged to a peripheral portion of the crystal. In this regard, it is explained that a substrate, in which the normal to the principal surface has an inclination angle of 1° or more and 10° or less relative to the <0001> direction of a gallium nitride seed crystal layer, is used as the base substrate and the inclination angle exceeding 10° is not preferable because microsteps are generated during crystal growth, and the melt is entangled into the microsteps to generate vacuoles (inclusions). In general, a macrostep refers to a step having a height difference on the order of micrometers which can be observed visually or with a microscope of low power easily, and a microstep refers to a step, e.g., an atomic step, having a height difference on the order of nanometers.

Patent Document 1: Japanese Unexamined Patent Application Publication No. 2009-51686

DISCLOSURE OF INVENTION

Meanwhile, the present inventors found that grain boundaries were sometimes formed from the principal surface of the base substrate obliquely upward during crystal growth, and if the dislocation inherited from the principal surface of the base substrate to a growing crystal came up against a grain boundary, propagation of the dislocation was interrupted by the grain boundary. In general, the base substrate is produced by a vapor phase method and, therefore, the dislocation density is high, so that the dislocation is inherited into the crystal in a liquid phase method as well. However, in the case where the propagation of dislocation can be stopped by a grain boundary generated during crystal growth, dislocation hardly appears on the crystal surface after completion of crystal growth. Consequently, if a gallium nitride single crystal is further grown on the resulting crystal in such a way that a growth surface becomes smooth, the upper layer gallium nitride single crystal has no defect due to dislocations, and grain boundaries and inclusions are small in number.

However, up to now, a method for controlling the place of generation of grain boundary during crystal growth of gallium nitride has not been known. Consequently, places at which grain boundaries are generated densely during crystal growth and places at which grain boundaries are generated coarsely are intermingled. Propagation of dislocation cannot be stopped at the places at which grain boundaries are generated coarsely and portions having a high dislocation density have sometimes been generated on the crystal surface after completion of crystal growth.

The present invention has been made in consideration of the above-described problems, and it is a main object to provide a base substrate suitable for stopping propagation of dislocation by taking advantage of grain boundaries during crystal growth of a group 13 nitride crystal.

The present inventors found that regarding stopping of propagation of dislocation by taking advantage of grain boundaries during crystal growth of a group 13 nitride crystal, in the case where steps having a height difference of 10 to 40 μm were disposed on a base substrate, grain boundaries were generated and the starting points of the grain boundaries were in the vicinity of the height differences of the steps and, therefore, generation of grain boundary was able to be controlled by the step of the base substrate. As a result, the present invention has been completed.

A base substrate according to the present invention is provided with a seed crystal layer of group 13 nitride, wherein a principal surface includes a plurality of steps having a height difference on the order of micrometers. This base substrate is used for a flux method in a manner as described below, for example. That is, the base substrate is immersed in a mixed melt containing a group 13 metal and an alkali metal and a group 13 nitride crystal is grown on the principal surface of the base substrate while a nitrogen gas is introduced into the mixed melt concerned. When the group 13 nitride crystal is grown on the principal surface, grain boundaries are generated obliquely upward and the starting points of the grain boundaries were in the vicinity of the height differences of the steps. Meanwhile, it is believed that dislocations included in the seed crystal layer are propagated in a direction intersecting the movement direction of the grain boundary (the direction perpendicular to the principal surface) and it is believed that propagation of dislocation is stopped by the grain boundary at a point at which the grain boundary and the dislocation intersect and the dislocation is not propagated beyond the grain boundary. Therefore, according to the base substrate of the present invention, the starting point of grain boundary can be controlled by the position at which the height difference of the step is formed on the principal surface and, in turn, propagation of dislocations from the base substrate can be interrupted by a small number of steps.

Here, the term "order of micrometers" refers to 1 to 100 µm. Furthermore, it is preferable that the height difference of the step is 10 to 40 µm. The height difference of the step of less than 10 µm is not preferable because the height difference may be disappeared through meltback of the seed crystal corresponding to the height difference before growth of a group 13 nitride crystal. The height difference of the step of more than 40 µm is not preferable because the amount of inclusions entangled into the grain boundary or the vicinity thereof increases excessively. Meanwhile, all the terrace widths of individual steps may take on the same value, but various values may be employed on a step basis. Regarding this point, the same goes for the height difference. In this regard, the base substrate in Patent Document 1 has microsteps, but the steps are different from the steps according to the present invention in that the substrate surface is mirror-finished and the height difference is on the order of nanometers and, therefore, is minute.

In the base substrate according to the present invention, an edge of the above-described step may be nearly parallel to an a-face of the group 13 nitride crystal, be nearly parallel to an m-face, or point any direction other than them. However, it is preferable that the edge is formed nearly parallel to the a-face. The case where the edge of the height difference is formed parallel to the a-face is preferable as compared with the case where the edge is formed parallel to the m-face because grain boundary extends at an angle close to the c-face and, thereby, a wide region is covered with the grain boundary when the growth thicknesses are the same. In this regard, the term "nearly parallel to an a-face" refers to parallel to an a-face, as a matter of course, and substantially parallel to an a-face (for example, in the direction forming an angle of less than 5° with the a-face).

A group 13 nitride crystal according to the present invention is grown on the principal surface of the above-described base substrate according to the present invention, wherein when a cross-section of the above-described group 13 nitride crystal cut along the {1-100} is observed, a grain boundary starts from the height difference of the above-described base substrate and extends obliquely in a direction inclined 55° to 75° relative to the <0001> direction in the GaN single crystal. According to this group 13 nitride crystal, most of or all over the principal surface of the base substrate is covered up with grain boundaries reaching the surface of the group 13 nitride crystal from the principal surface of the base substrate, so that dislocations propagated from the seed crystal layer of the base substrate are interrupted by the grain boundaries. Therefore, if another group 13 nitride crystal is further grown on the resulting group 13 nitride crystal under a mild condition in such a way that a growth surface becomes smooth, the upper layer group 13 nitride crystal has few defects due to dislocations, and grain boundaries and inclusions are small in number.

A group 13 nitride crystal according to the present invention is grown on the principal surface of the above-described base substrate according to the present invention, wherein when the above-described group 13 nitride crystal is observed from the surface side, grain boundaries which start from the height differences of the above-described base substrate and all over the principal surface of the above-described base substrate is covered up with grain boundaries reaching the surface of the above-described group 13 nitride crystal. According to this group 13 nitride crystal, all over the principal surface of the base substrate is covered up with grain boundaries reaching the surface of the group 13 nitride crystal from the principal surface of the base substrate, so that dislocations propagated from the seed crystal layer of the base substrate are interrupted and hardly reach the surface. Therefore, if another group 13 nitride crystal is further grown on the resulting group 13 nitride crystal under a mild condition in such a way that a growth surface becomes smooth, the upper layer group 13 nitride crystal hardly has defects due to dislocations, and grain boundaries and inclusions are small in number.

For example, it is preferable that the terrace width W is specified to satisfy $W \leq T/\tan\theta$, where the thickness of group 13 nitride crystal crystallized on the principal surface of the base substrate is represented by T (µm), the terrace width of each step is represented by W (µm), and maximum value of the angle formed by a grain boundary with the principal surface is represented by $\theta$ (°). According to this, theoretically, when the group 13 nitride crystal is observed from the surface side, all over the principal surface of the base substrate is covered up with grain boundaries reaching the surface of the group 13 nitride crystal from the principal surface of the base substrate. In particular, if the terrace width W is set in such a way that $W=T/\tan\theta$ holds, the terrace width is larger than that in the case where $W<T/\tan\theta$ holds and, thereby, the number of steps disposed on the principal surface of the base substrate can be reduced.

A method for manufacturing a group 13 nitride crystal according to the present invention includes the steps of immersing the above-described base substrate in a mixed melt containing a group 13 metal and an alkali metal and growing the group 13 nitride crystal on the principal surface of the base substrate while a nitrogen gas is introduced into the mixed melt. Regarding this manufacturing method, when the group 13 nitride crystal is grown on the principal surface, grain boundaries are generated obliquely upward and the starting point of the grain boundaries were in the vicinity of the height differences of the steps. Meanwhile, it is believed that dislocation included in the seed crystal layer is propagated in a direction intersecting the movement direction of the grain boundary (the direction perpendicular to the principal surface) and it is believed that propagation of dislocation is stopped by the grain boundary at a point at which the grain boundary and the dislocation intersect and the dislocation is not propagated beyond the grain boundary. Therefore, the starting point of grain boundary can be controlled by the position at which the height difference of the step is formed on the principal surface and, in turn, propagation of dislocations from the base substrate can be interrupted by a small number of steps.

Regarding the method for growing a group 13 nitride crystal according to the present invention, examples of group 13 nitrides include boron nitride (BN), aluminum nitride (AlN), gallium nitride (GaN), indium nitride (InN), and thallium nitride (TlN), and among them, gallium nitride is preferable. As for the base substrate, for example, a sapphire substrate, a silicon carbide substrate, and a silicon substrate provided with a thin film of the same type as the group 13 nitride on the surface may be used, or a substrate of the same type as the group 13 nitride may be used. A flux may be selected among various metals appropriately in accordance with the type of the group 13 metal. For example, in the case where the group 13 metal is gallium, an alkali metal is preferable, metal sodium or metal potassium is more preferable, and metal sodium is further preferable.

By the way, in the present specification, the term "grain boundary" refers to a discontinuous boundary between adjacent crystal grains. The term "inclusion" refers to a melt entangled into a grain boundary. The inclusion may be referred to as a vacuole. Meanwhile, the crystal orientation has been previously used in the field of the inorganic chemistry. The crystal orientation of a hexagonal group 13 nitride single crystal will be described briefly. Regarding the hexagonal crystal, the c-face, which is a face perpendicular to the c axis, is the (0001) face, and a −c-face is the (000-1) face. They are equivalent from the viewpoint of the symmetry and, therefore, are expressed as the {0001} face. Furthermore, as shown in FIG. 26, all the [0-110] direction, the [-1010] direction, the [-1100] direction, the [01-10] direction, the [10-10] direction, and the [1-100] direction are equivalent from the viewpoint of the symmetry and, therefore, are expressed as the <1-100>. In addition, a face perpendicular to the <1-100>, that is, the m-face, is expressed as the {1-100}. Moreover, all the [-2110] direction, the [-12-10] direction, the [11-20] direction, the [2-1-10] direction, the [1-210] direction, and the [-1-120] direction are equivalent from the viewpoint of the symmetry and, therefore, are expressed as the <11-20>. In addition, a face perpendicular to the <11-20>, that is, the a-face, is expressed as the {11-20}.

BEST MODES FOR CARRYING OUT THE INVENTION

Figure 1:
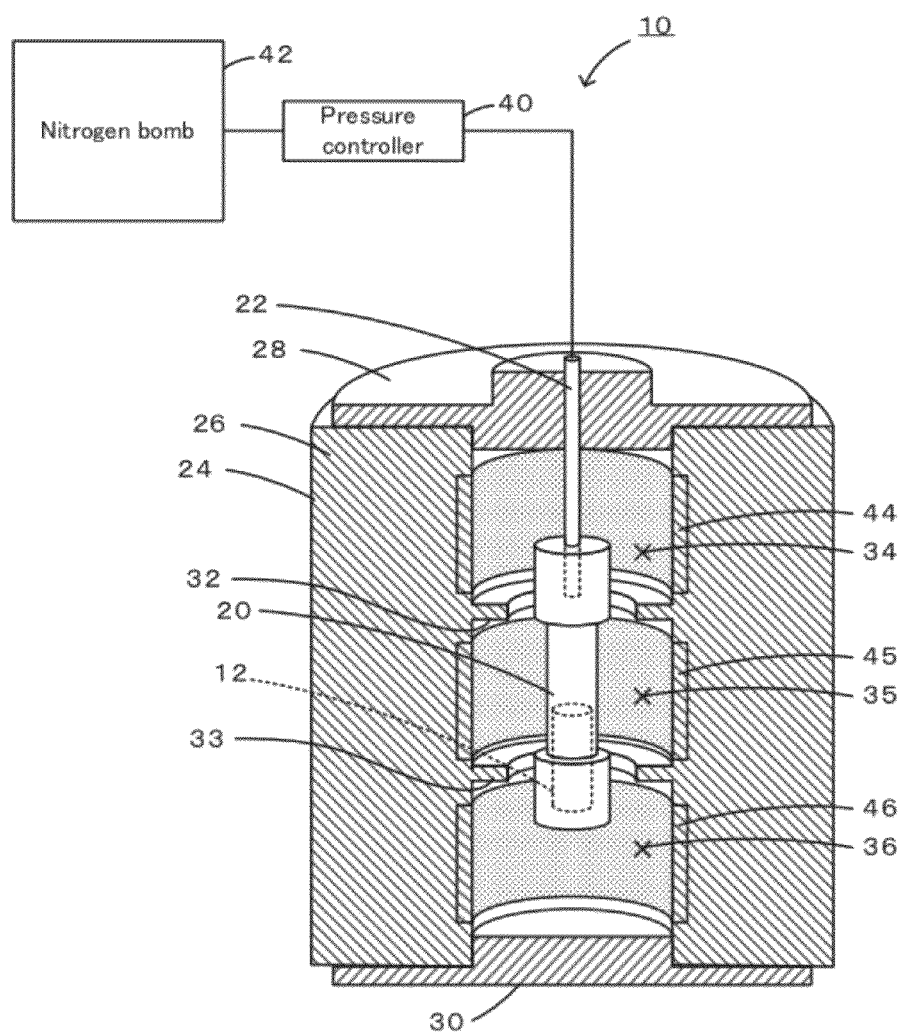
FIG. 1 is an explanatory diagram showing the whole configuration of a crystal plate producing apparatus 10.
Figure 2:
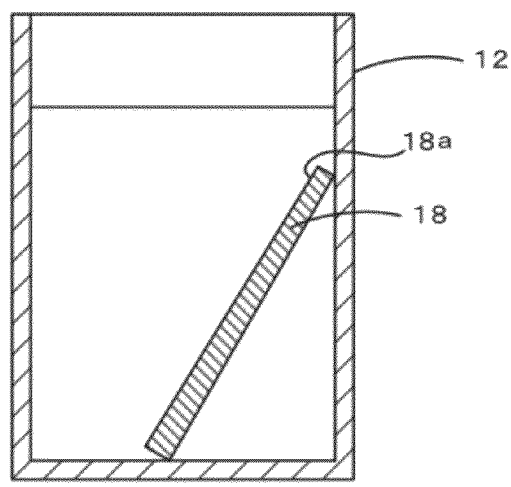
FIG. 2 is an explanatory diagram (sectional view) of a growth container 12.
Figure 3:
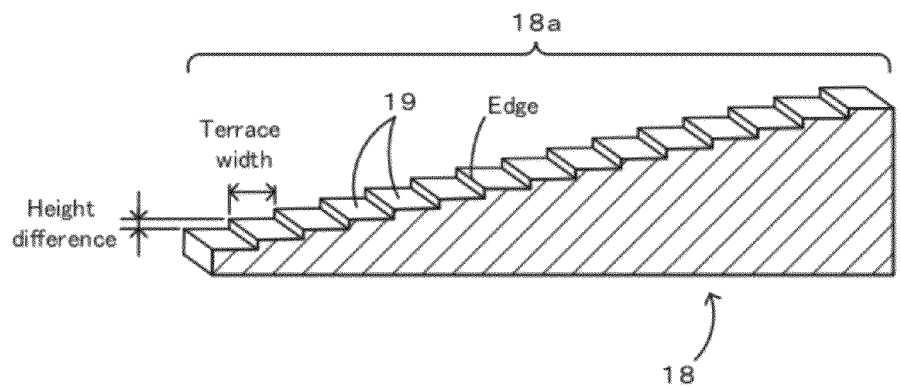
FIG. 3 is an explanatory diagram of a base substrate 18 in the case where an edge is parallel to the a-face, (a) shows a perspective view (partial cross-section), and (b) shows a plan view.
Figure 3:
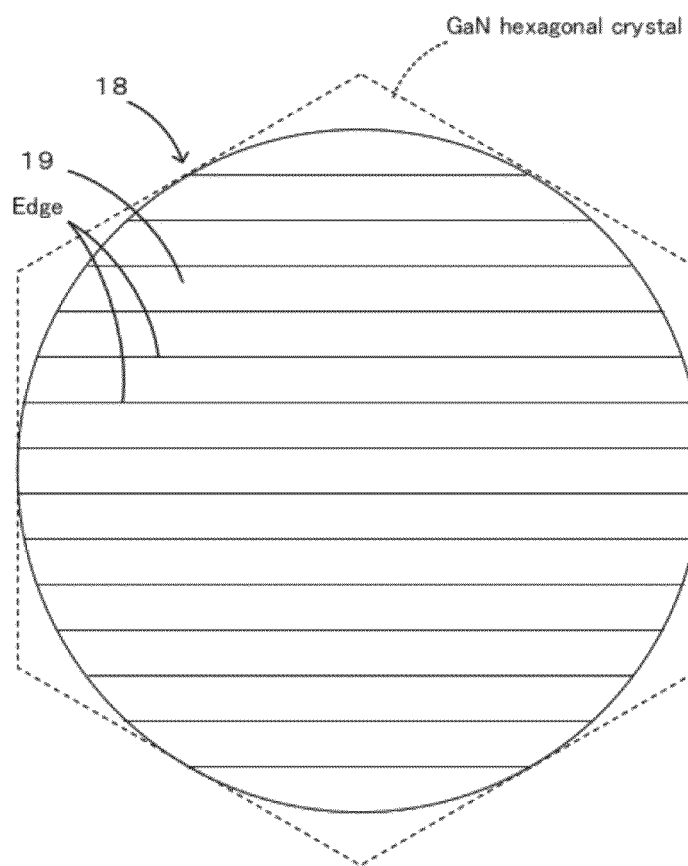
Figure 4:
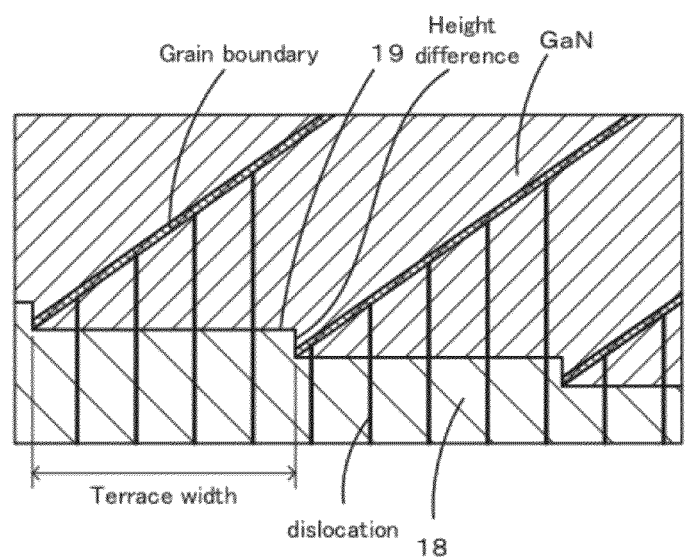
FIG. 4 is an explanatory diagram of a dislocation reduction mechanism of a GaN crystal.

An apparatus suitable for executing a method for growing a group 13 nitride crystal according to the present invention will be described below with reference to the drawings. FIG. 1 is an explanatory diagram showing the whole configuration of a crystal plate producing apparatus 10. FIG. 2 is an explanatory diagram (sectional view) of a growth container 12. FIG. 3 is an explanatory diagram of a base substrate 18. FIG. 4 is an explanatory diagram of a dislocation reduction mechanism. In the following explanation, GaN is employed as an example of a group 13 nitride.

As shown in FIG. 1, the crystal plate producing apparatus 10 is provided with a growth container 12, a base substrate 18 disposed in this growth container 12, a reaction container 20 to store the growth container 12, an electric furnace 24 in which this reaction container 20 is disposed, and a pressure controller 40 disposed at some midpoint of a pipe connecting a nitrogen bomb 42 and a stainless steel reaction container 20.

The growth container 12 is an aluminum crucible in the shape of a tube with a bottom. As shown in FIG. 2, the base substrate 18 provided with a GaN seed crystal layer is disposed in this growth container 12. Furthermore, metal gallium and a flux are stored in the growth container 12. As for the flux, metal sodium is preferable. Metal gallium and the flux are formed into a mixed melt through heating.

As shown in FIG. 2, the base substrate 18 is disposed in such a way that the principal surface 18a has an angle relative to the horizontal direction (that is, obliquely). As shown in FIG. 3, regarding this base substrate 18, a plurality of steps 19 are disposed stepwise on the principal surface (c-face) 18a. Each step 19 has a height difference of 10 to 40 μm, and an edge is disposed parallel to the a-face of a GaN hexagonal crystal. Furthermore, the terrace width of each step 19 is set at a predetermined width. The predetermined width is set in such a way that after a GaN crystal is grown on the principal surface 18a of the base substrate 18, the principal surface 18a is covered up with grain boundaries when the grown GaN crystal is observed from the surface side. In this regard, the plurality of steps 19 can be formed through, for example, dry etching, sand blasting, lasing, and dicing.

The reaction container 20 is made from stainless steel, and an inlet pipe 22 capable of introducing a nitrogen gas into an upper portion is inserted. The lower end of this inlet pipe 22 is located in the reaction container 20 and in an upper space of the growth container 12. Meanwhile, the upper end of the inlet pipe 22 is connected to the pressure controller 40.

The electric furnace 24 is provided with a hollow cylinder 26, in the inside of which the reaction container 20 is disposed, and an upper lid 28 and a lower lid 30 to block an upper opening and a lower opening, respectively, of this cylinder 26. This electric furnace 24 is of three-zone heater type and is divided into three parts, an upper zone 34, a middle zone 35, and a lower zone 36, by two ring-shaped diaphragms 32 and 33 disposed on the inner wall of the cylinder 26. Furthermore, an upper heater 44 is buried in the inner wall surrounding the upper zone 34, a middle heater 45 is buried in the inner wall surrounding the middle zone 35, and a lower heater 46 is buried in the inner wall surrounding the lower zone 36. Each of the heaters 44, 45, and 46 is controlled by a heater control apparatus, although not shown in the drawing, in such a way as to reach a target temperature independently set in advance. In this regard, the reaction container 20 is stored in such a way that the upper end is located in the upper zone 34 and the lower end is located in the lower zone 36.

The pressure controller 40 controls the pressure of the nitrogen gas fed to the reaction container 20 in such a way as to become a desired pressure set in advance.

An example of use of the thus configured crystal plate producing apparatus 10 according to the present embodiment will be described. Initially, the base substrate 18 is prepared and is put into the growth container 12. At this time, the base substrate 18 is supported in such a way as to have an angle of 10° or more and less than 90° (preferably 45° or more and less than 90°) relative to the horizontal direction. Meanwhile, metal gallium and metal sodium serving as a flux are prepared, they are weighed in such a way that a desired molar ratio is ensured and are stored into the growth container 12. The resulting growth container 12 is put into the reaction container 20, the inlet pipe 22 is connected to the reaction container 20, and a nitrogen gas is filled into the reaction container 20 from the nitrogen bomb 42 through the pressure controller 40. The resulting reaction container 20 is stored into the cylinder 26 of the electric furnace 24 in such a way as to reach the lower zone 36 from the upper zone 34 via the middle zone 35, and the lower lid 30 and the upper lid 28 are closed. Then, the inside of the reaction container 20 is controlled by the pressure controller 40 in such a way as to have a predetermined nitrogen gas pressure, and the upper heater 44, the middle heater 45, and the lower heater 46 are controlled by the heater control apparatus, although not shown in the drawing, in such a way as to reach the respective predetermined target temperatures, so that a crystal of gallium nitride is grown. The nitrogen gas pressure is preferably set at 1 to 7 MPa and is more preferably set at 2 to 6 MPa. Meanwhile, the average temperature of the three heaters is preferably set at 700° C. to 1,000° C. and is more preferably set at 800° C. to 900° C. The growth time of the gallium nitride crystal may be set appropriately in accordance with the heating temperature and the pressure of the pressurized nitrogen gas and may be set within the range of, for example, several hours to several hundred hours.

According to the present embodiment described above in detail, as shown in FIG. 4, when a GaN crystal is grown on the principal surface 18a of the base substrate 18, grain boundaries are generated obliquely upward and the starting points of the grain boundaries are in the vicinity of the height differences of the steps 19. Meanwhile, it is believed that dislocation included in the seed crystal layer of the base substrate 18 is propagated in a direction intersecting the movement direction of the grain boundary (the direction perpendicular to the principal surface) and it is believed that propagation of dislocation is stopped by the grain boundary at a point at which the grain boundary and the dislocation intersect and the dislocation is not propagated beyond the grain boundary. Therefore, the starting point of grain boundary can be controlled by the position at which the height difference of the step 19 is formed on the principal surface 18a and, in turn, propagation of dislocations from the base substrate 18 can be interrupted by a small number of steps 19.

Furthermore, when the GaN crystal after being grown on the principal surface 18a of the base substrate 18 is observed from the surface side, all over the principal surface 18a of the base substrate 18 is covered up with grain boundaries reaching the surface of the GaN crystal from the principal surface 18a of the base substrate 18. Consequently, dislocations propagated from the seed crystal layer of the base substrate 18 to the GaN crystal hardly reach the surface of the GaN crystal.

Moreover, if a GaN crystal is further grown on the GaN crystal grown on the principal surface 18a of the base substrate 18 in such a way that a growth surface becomes smooth, the upper layer GaN crystal has few defects due to dislocations, and grain boundaries and inclusions are small in number because there are almost no dislocations which are propagated from the lower layer GaN crystal.

It is to be understood that the present invention is not limited to the embodiments described above, and can be realized in various forms within the technical scope of the present invention.

Figure 5:
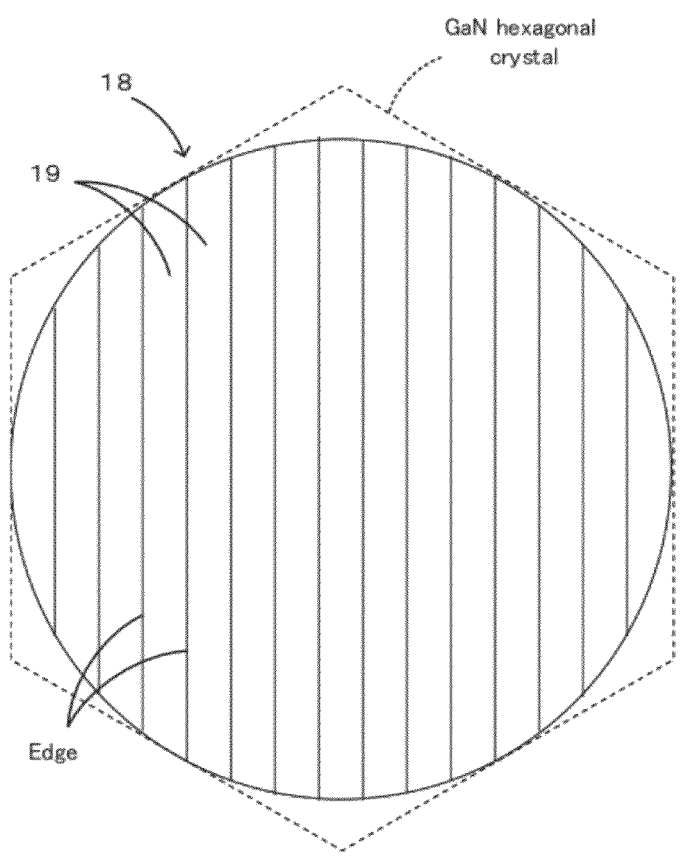
FIG. 5 is a plan view in the case where an edge is parallel to the m-face.
Figure 6:
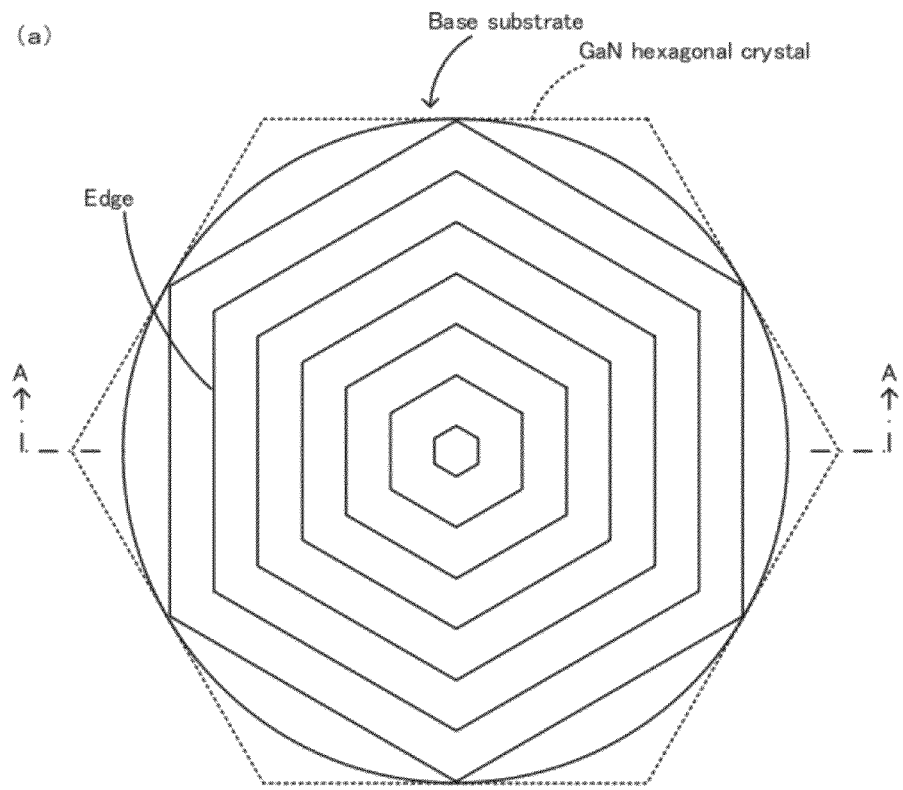
FIG. 6 is an explanatory diagram of a base substrate in a concave shape in the center having a hexagonal pattern, (a) is a plan view, and (b) is a sectional view of a section taken along a line A-A.
Figure 6:
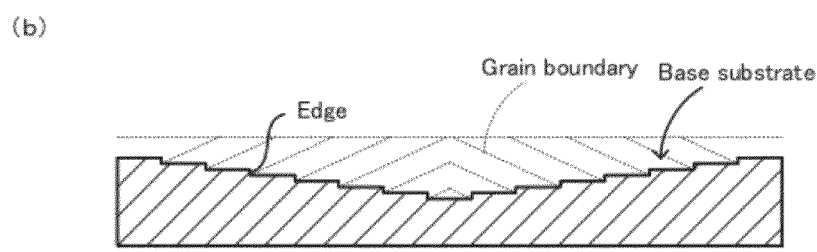
Figure 7:
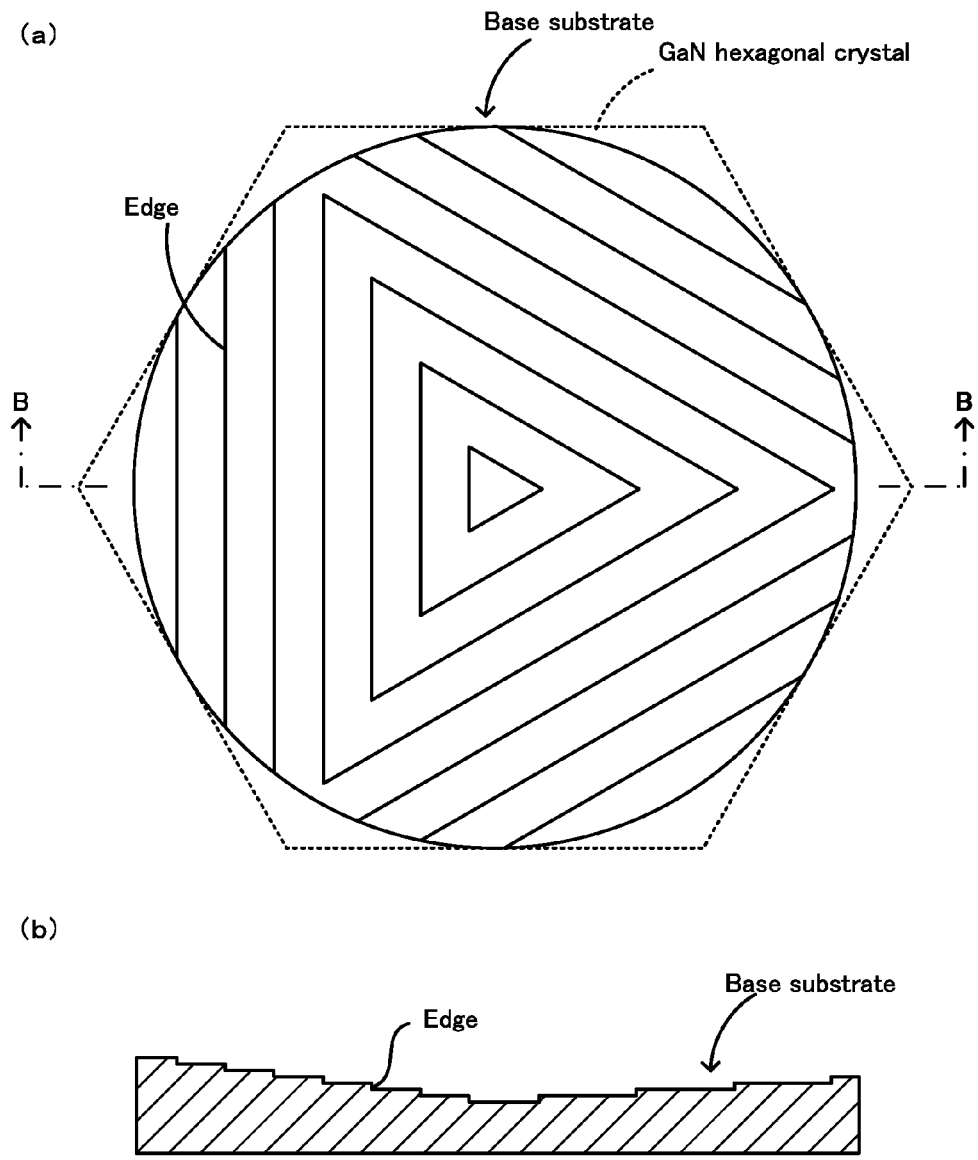
FIG. 7 is an explanatory diagram of a base substrate in a concave shape in the center having a triangular pattern, (a) is a plan view, and (b) is a sectional view of a section taken along a line B-B.
Figure 8:
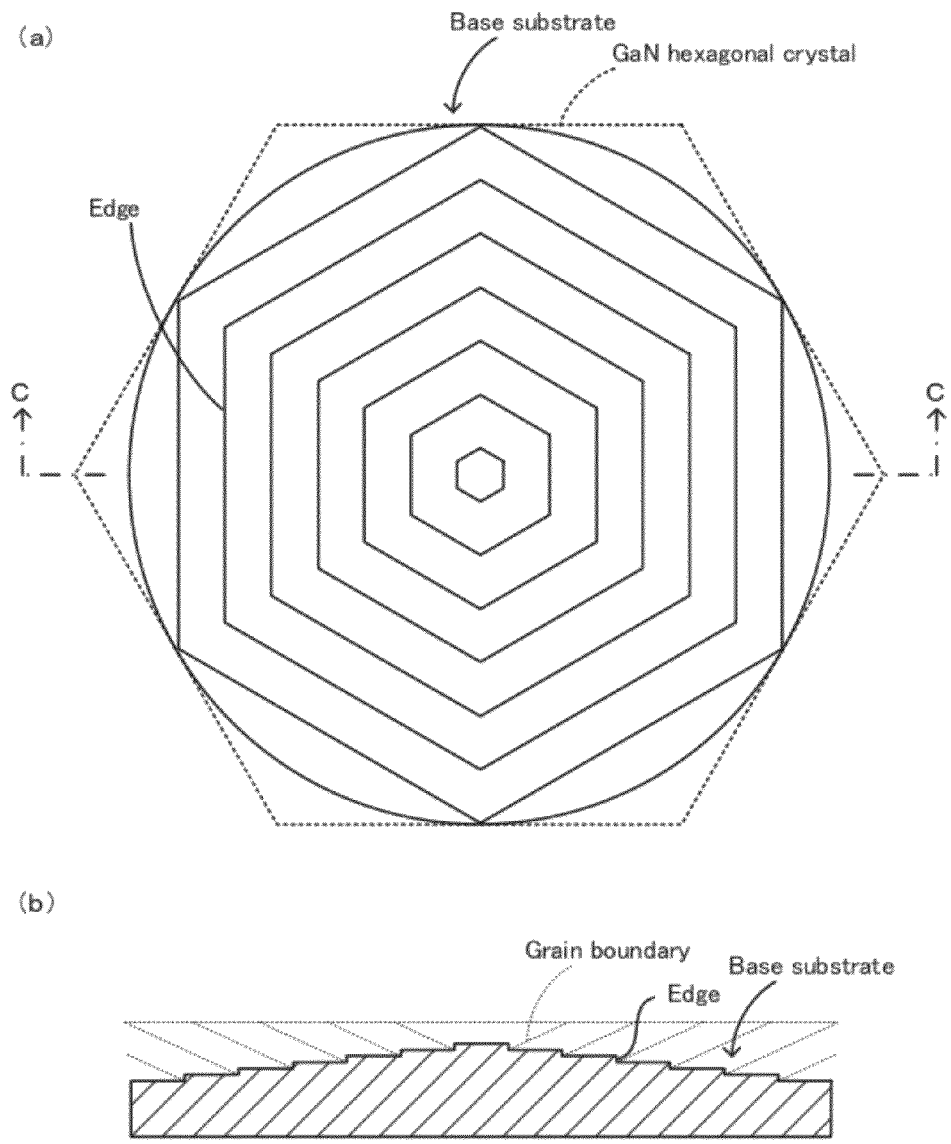
FIG. 8 is an explanatory diagram of a base substrate in a convex shape in the center having a hexagonal pattern, (a) is a plan view, and (b) is a sectional view of a section taken along a line C-C.

For example, in the above-described embodiment, the base substrate 18 shown in FIG. 3 is adopted. Instead, as shown in FIG. 5, a base substrate 18 having edges parallel to the m-face of a GaN hexagonal crystal may be adopted. Alternatively, steps may be formed into a pattern taking on a shape with a dented center (concave shape in the center) when a vertical cross-section of the base substrate is observed and taking on a point-symmetry figure when the base substrate is observed from the upper surface. Examples of point-symmetry figures include polygons, e.g., a triangle, a tetragon, a pentagon, and a hexagon. Among them, a hexagonal pattern in which edges of all steps are parallel to the a-face (refer to FIG. 6) and likewise, a triangular pattern (refer to FIG. 7) are preferable. In the case where the concave shape is adopted, there is an advantage that a maximum thickness of working for forming a plurality of steps is only a half the thickness shown in FIG. 3. Furthermore, grain boundaries are reliably introduced into the central region as well, dislocations of the central region can be reliably suppressed as compared with the shape with a protruded center (convex shape in the center, refer to FIG. 8).

In the above-described embodiment, heat convection may be generated in the mixed melt in the growth container 12. Concretely, the individual target temperatures may be set in such a way that the temperature of the lower heater 46 becomes higher than the temperatures of the upper heater 44 and the middle heater 45. According to the thus generated heat convection, the mixed melt is allowed to flow along the principal surface 18a of the base substrate 18 and, thereby, crystal growth in the direction along the principal surface 18a is facilitated.

Figure 9:
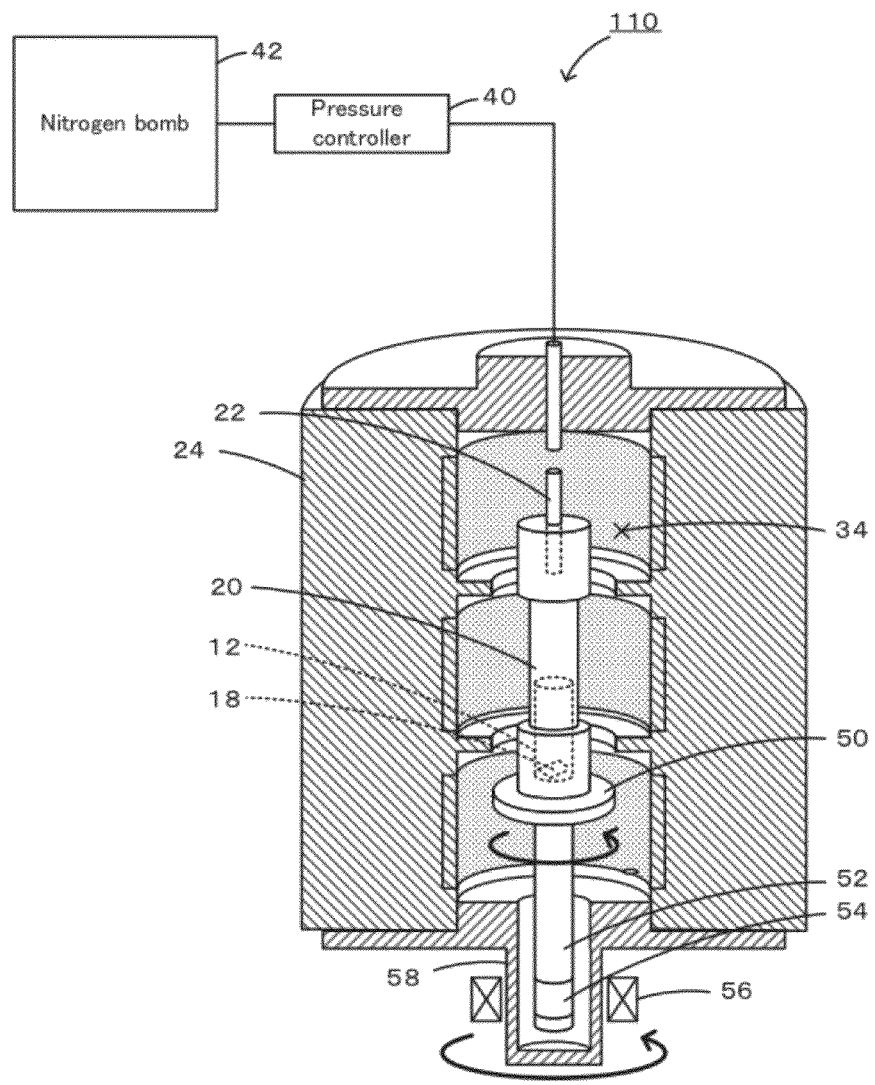
FIG. 9 is an explanatory diagram showing the whole configuration of a crystal plate producing apparatus 110.

In the above-described embodiment, the crystal plate producing apparatus 10 shown in FIG. 1 is adopted. Instead, a crystal plate producing apparatus 110 shown in FIG. 9 may be adopted. The crystal plate producing apparatus 110 is the same as the crystal plate producing apparatus 10 except that the reaction container 20 can be rotated. Therefore, only the points different from the crystal plate producing apparatus 10 will be described below. The reaction container 20 is placed on a disc-shaped turntable 50 provided with a rotation shaft 52 on the lower surface. The rotation shaft 52 has an internal magnet 54 and is rotated along with rotation of an external magnet 56 which is disposed taking the shape of a ring outside a tubular casing 58 and which is rotated by an external motor, although not shown in the drawing. The inlet pipe 22 inserted into the reaction container 20 is cut in the upper zone 34. Consequently, when the rotation shaft 52 is rotated, the reaction container 20 placed on the turntable 50 is also rotated without any trouble. Meanwhile, the nitrogen gas filled into the electric furnace 24 from the nitrogen bomb 42 through the pressure controller 40 is introduced into the reaction container 22 from the inlet pipe 22. In the case where this crystal plate producing apparatus 110 is used, a flow of the mixed melt along the surface of the base substrate 18 can be generated in the growth container 12, and crystal growth in the direction along the principal surface 18a is facilitated. In this regard, it is preferable that the posture of the base substrate 18 in the growth container 12 is determined in such a way that a spiral flow generated in the mixed melt becomes parallel to the surface of the base substrate 18.

EXAMPLES

Example 1

A GaN crystal plate was produced by using the crystal plate producing apparatus 10 shown in FIG. 1. The procedure thereof will be described below in detail. Initially, a plurality of steps 19 were formed on the principal surface (c-face) 18a of the base substrate 18 of 10 mm long×15 mm wide by a sandblast method through the use of a mask pattern. As for abrasive grains used, the material was alumina ($Al_2O_3$), the grain size was 10 to 20 μm, and the average grain size was 15 μm. Meanwhile, regarding each of the steps 19, the height difference was specified to be 10 μm, the edge was specified to be parallel to the a-face of the GaN hexagonal crystal, and the terrace width was specified to be 2 mm.

Subsequently, in a glove box under an argon atmosphere, the base substrate 18 provided with the plurality of steps 19 was stored into the growth container 12 in such a way as to have an angle of 70° relative to the horizontal direction. In addition, 3 g of metal gallium (Ga) and 4 g of metal sodium (Na) serving as a flux were weighed and put into the growth container 12. The resulting growth container 12 was put into the reaction container 20, the reaction container 20 was put into the cylinder 26 of the electric furnace 24 while nitrogen purging was performed, and the upper lid 28 and the lower lid 30 were closed so as to seal hermetically. Thereafter, a gallium nitride crystal was grown under a predetermined growth condition. In the present embodiment, as for the growth condition, the nitrogen pressure was specified to be 4.5 MPa, the average temperature was specified to be 875° C., and growth was effected for 100 hours. After the reaction was completed, natural cooling to room temperature was performed. Then, the reaction container 20 was opened, and the growth container 12 was taken out of the inside. Ethanol was put into the growth container 12, metal sodium was dissolved into ethanol and, thereafter, a grown gallium nitride crystal plate was recovered.

Figure 10:
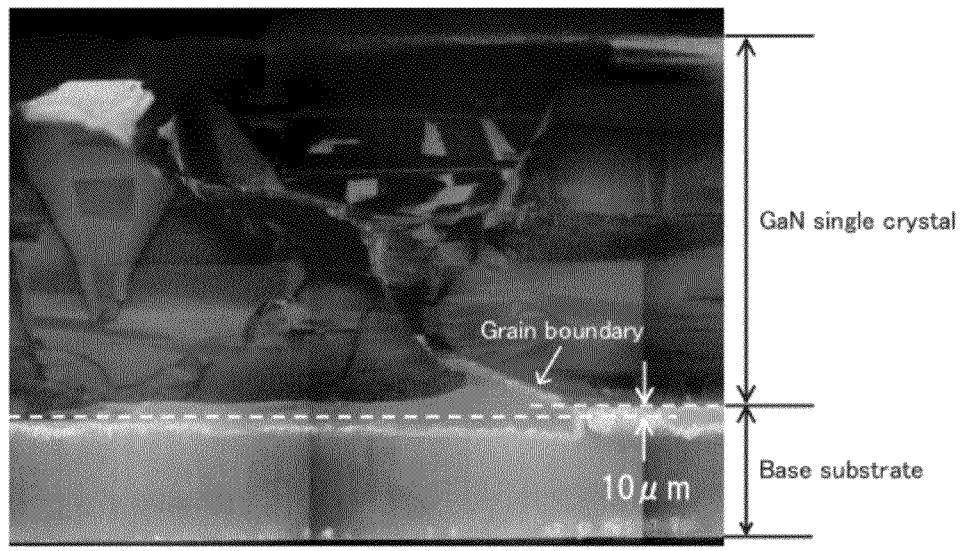
FIG. 10 is a photograph of a fluorescent microscope image of a cross-section of a GaN single crystal in Example 1.

FIG. 10 shows a fluorescent microscope image when light with a wavelength of 330 to 385 nm was applied to a cross-section of the recovered GaN crystal cut along the {1-100}. In this fluorescent microscope image, the base substrate 18 appears light green (light gray in FIG. 10), and the GaN single crystal appears indigo-blue (dark gray in FIG. 10). In the GaN single crystal, an impurity band light-emission portion palely glowing as a streak (light gray in FIG. 10) is a grain boundary. In this regard, the impurity band light-emission refers to light emission caused by relaxation of an electron excited to the level, which is a deep level formed by the impurity. In FIG. 10, the grain boundary was generated obliquely upward in the GaN single crystal and the starting point of the grain boundary were in the vicinity of the height difference of the step. Concretely, in FIG. 10, the grain boundary was ascertained to be extended in the direction inclined about 55° to 75° relative to the <0001> direction in the GaN single crystal and the starting point of the grain boundary was in the vicinity of the height difference of the step and.

Figure 11:
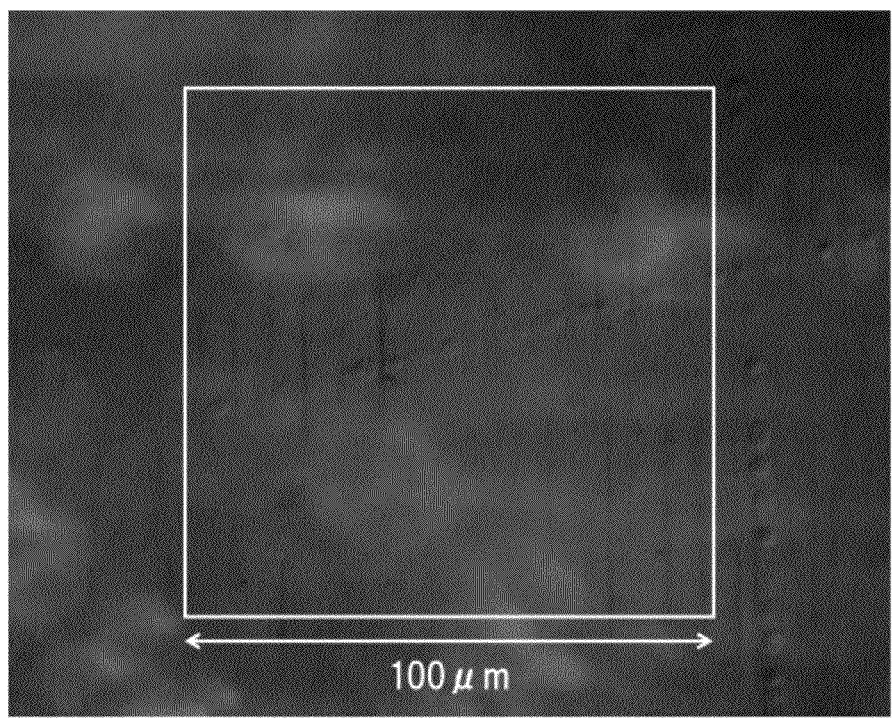
FIG. 11 is a photograph of an etch-pit observation image of a GaN single crystal in Example 1.

The surface of the resulting GaN single crystal was mirror-finished and was immersed in a mixed solution of sulfuric acid and phosphoric acid at 250° C. for about 2 hours, so that an etching treatment was performed. After the etching, among the surface of the GaN single crystal, a place just above the formed grain boundary (or inclusion) was subjected to differential interference image observation through the use of an optical microscope, so as to observe an etch-pit derived from dislocation and determine the etch-pit density (EPD). The EPD was determined by dividing the number of etch-pits in a measurement area 100 μm square by the area of the measurement area. FIG. 11 shows an etch-pit observation image at this time. In FIG. 11, no etch-pit was observed in the measurement area and EPD was less than $1 \times 10^4/cm^2$. As described above, regarding the place just above the formed grain boundary (or inclusion) among the surface of the GaN single crystal, no dislocation was observed and, therefore, it is believed that propagation of dislocation in the GaN single crystal was stopped by the grain boundary.

In this regard, in FIG. 10, the horizontal distance from the height difference to the GaN single crystal surface reached by the grain boundary was about 2 mm. Therefore, it is clear that all over the principal surface is covered up with the grain boundary by specifying the terrace width to be the horizontal distance, 2 mm, or less.

Example 2

Figure 12:
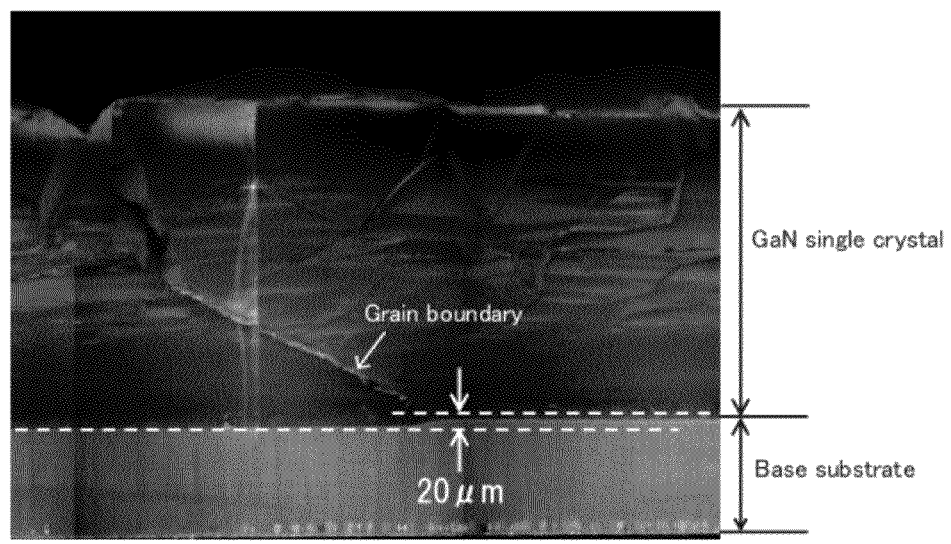
FIG. 12 is a photograph of a fluorescent microscope image of a cross-section of a GaN single crystal in Example 2.
Figure 13:
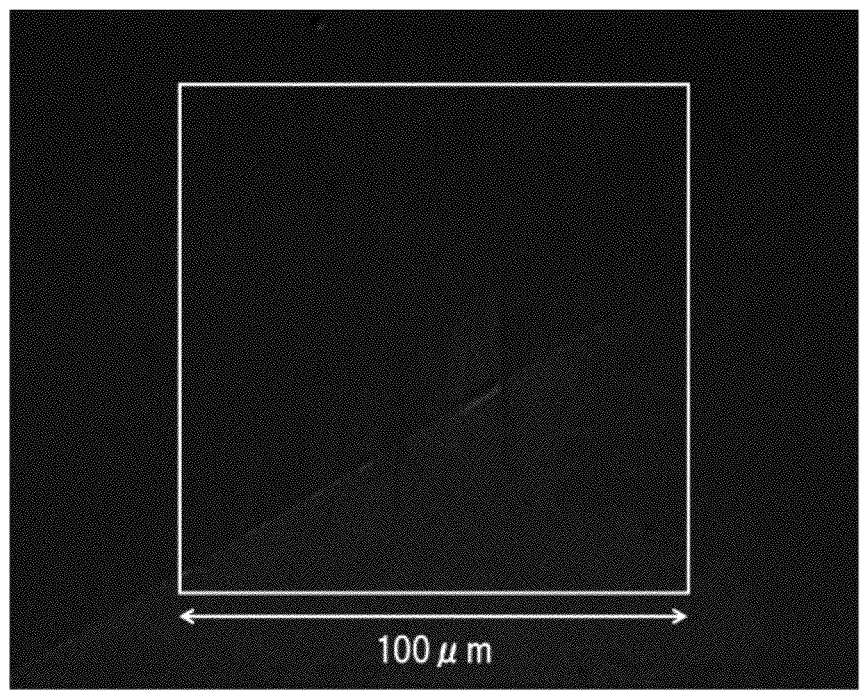
FIG. 13 is a photograph of an etch-pit observation image of a GaN single crystal in Example 2.

A GaN single crystal was grown and recovered from the growth container 12 and a fluorescent microscope image of the recovered GaN crystal was photographed in the same manner as in Example 1 except that the height difference of the step 19 formed on the base substrate 18 was specified to be 20 μm. FIG. 12 shows the fluorescent microscope image at this time. As is clear from FIG. 12, the grain boundary was generated obliquely upward in the GaN single crystal and the starting point of the grain boundary was in the vicinity of the height difference of the step. Concretely, in FIG. 12, the grain boundary was ascertained to be extended in the direction inclined about 55° to 75° relative to the <0001> direction in the GaN single crystal and the starting point of the grain boundary was in the vicinity of the height difference of the step. Meanwhile, the differential interference image observation was performed in the same manner as in Example 1, an etch-pit derived from dislocation was observed, and EPD was determined. FIG. 13 shows an etch-pit observation image at this time. In FIG. 13, no etch-pit was observed in the measurement area and EPD was less than $1 \times 10^4/cm^2$.

Example 3

Figure 14:
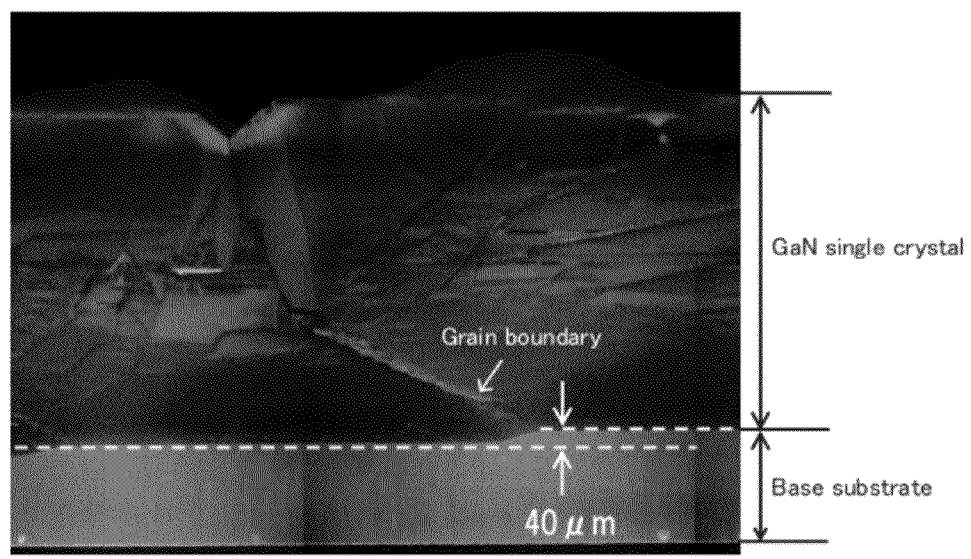
FIG. 14 is a photograph of a fluorescent microscope image of a cross-section of a GaN single crystal in Example 3.
Figure 15:
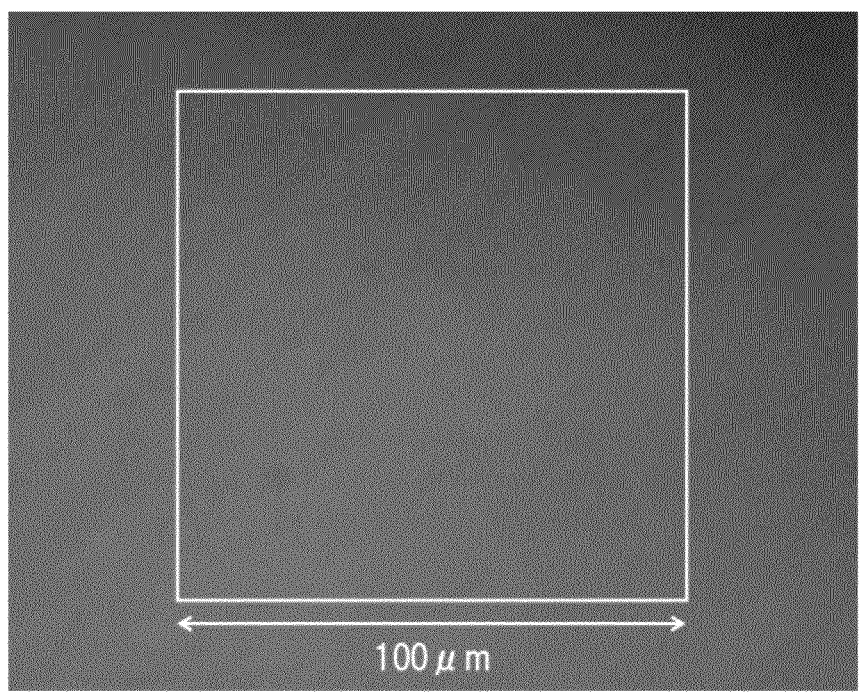
FIG. 15 is a photograph of an etch-pit observation image of a GaN single crystal in Example 3.

A GaN single crystal was grown and recovered from the growth container 12 and a fluorescent microscope image of the recovered GaN crystal was photographed in the same manner as in Example 1 except that the height difference of the step 19 formed on the base substrate 18 was specified to be 40 μm. FIG. 14 shows the fluorescent microscope image at this time. As is clear from FIG. 14, the grain boundary was generated obliquely upward in the GaN single crystal and the starting point of the grain boundary was in the vicinity of the height difference of the step. Concretely, in FIG. 14, the grain boundary was ascertained to be extended in the direction inclined about 55° to 75° relative to the <0001> direction in the GaN single crystal and the starting point of the grain boundary was in the vicinity of the height difference of the step. Meanwhile, the differential interference image observation was performed in the same manner as in Example 1, an etch-pit derived from dislocation was observed, and EPD was determined. FIG. 15 shows an etch-pit observation image at this time. In FIG. 15, no etch-pit was observed in the measurement area and EPD was less than $1 \times 10^4/cm^2$.

Example 4

Figure 16:
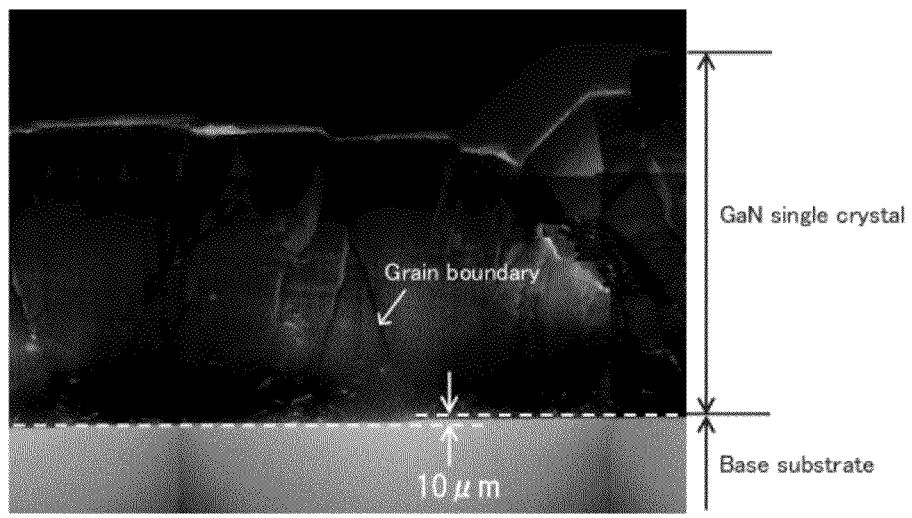
FIG. 16 is a photograph of a fluorescent microscope image of a cross-section of a GaN single crystal in Example 4.
Figure 17:
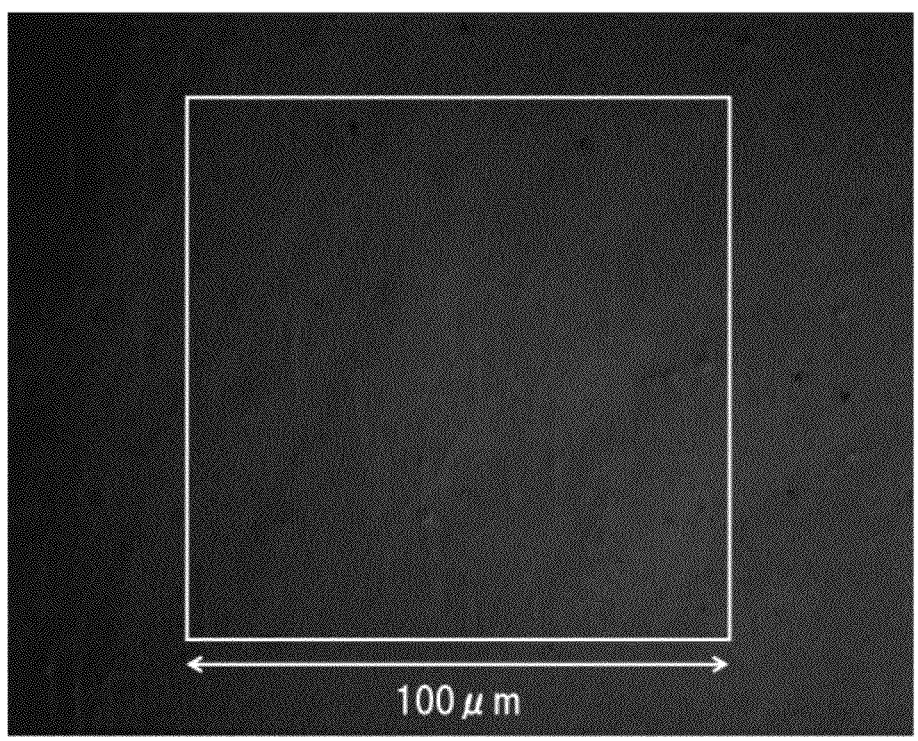
FIG. 17 is a photograph of an etch-pit observation image of a GaN single crystal in Example 4.

A GaN single crystal was grown and recovered from the growth container 12 in the same manner as in Example 1 except that the edge of the base substrate 18 was specified to be parallel to the m-face of the GaN hexagonal crystal, the height difference of the step 19 was specified to be 10 μm, and the terrace width was specified to be 1 mm. Subsequently, a fluorescent microscope image when light with a wavelength of 330 to 385 nm was applied to a cross-section of the recovered GaN crystal cut along the {11-20} was photographed. FIG. 16 shows the fluorescent microscope image at this time. In FIG. 16, the grain boundary was generated obliquely upward in the GaN single crystal and the starting point of the grain boundary was in the vicinity of the height difference of the step. Concretely, in FIG. 16, the grain boundary was ascertained to be extended in the direction inclined about 15° to 35° relative to the <0001> direction in the GaN single crystal and the starting point of the grain boundary was in the vicinity of the height difference of the step. Meanwhile, the differential interference image observation was performed in the same manner as in Example 1, an etch-pit derived from dislocation was observed, and EPD was determined. FIG. 17 shows an etch-pit observation image at this time. In FIG. 17, no etch-pit was observed in the measurement area and EPD was less than $1 \times 10^4/cm^2$.

Example 5

Figure 18:
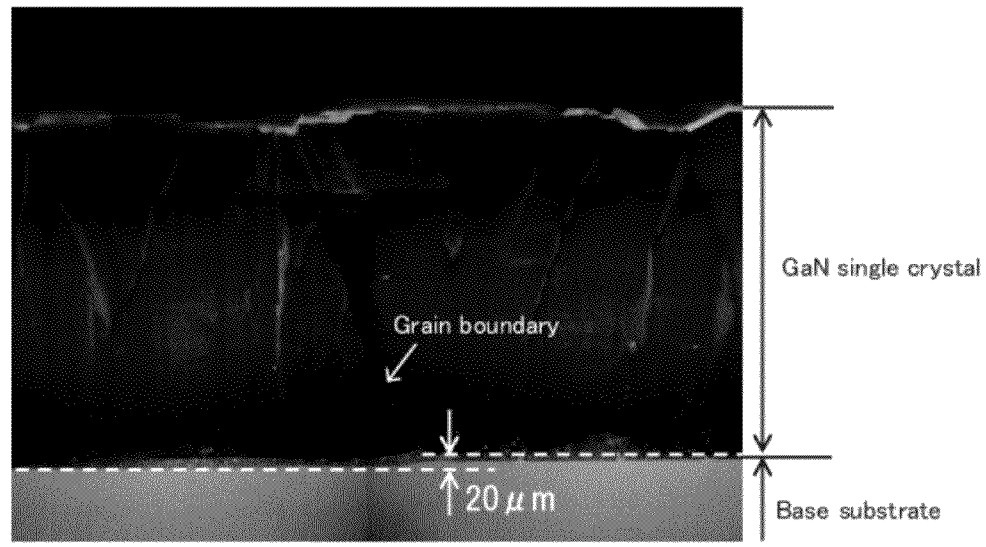
FIG. 18 is a photograph of a fluorescent microscope image of a cross-section of a GaN single crystal in Example 5.
Figure 19:
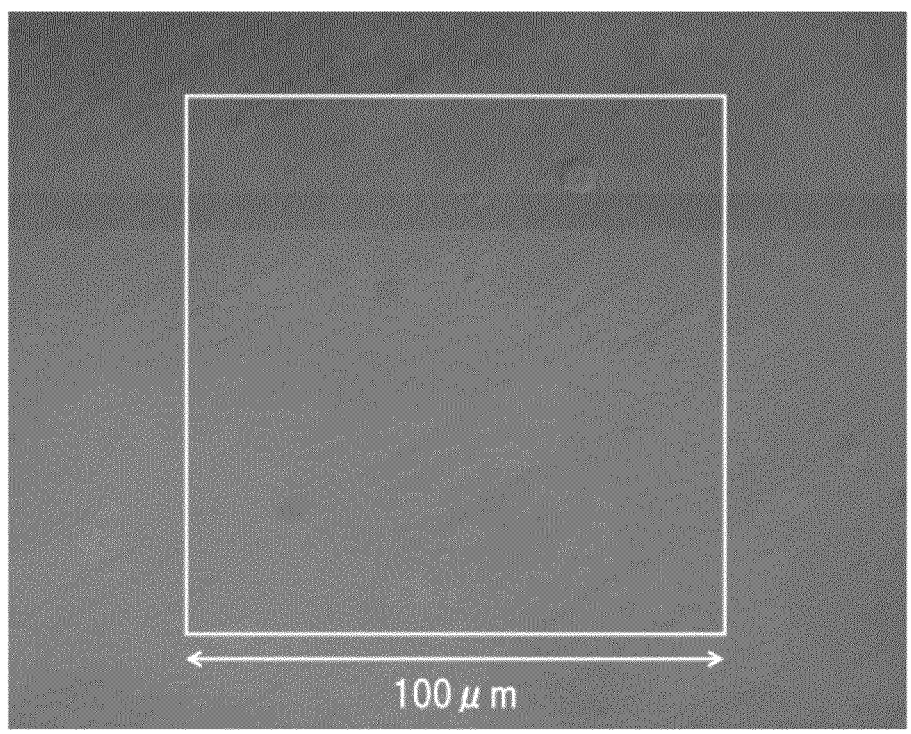
FIG. 19 is a photograph of an etch-pit observation image of a GaN single crystal in Example 5.

A GaN single crystal was grown and recovered from the growth container 12 and a fluorescent microscope image of the recovered GaN crystal was photographed in the same manner as in Example 4 except that the height difference of the step 19 formed on the base substrate 18 was specified to be 20 μm. FIG. 18 shows the fluorescent microscope image at this time. As is clear from FIG. 18, the grain boundary was generated obliquely upward in the GaN single crystal and starting point of the grain boundary was in the vicinity of the height difference of the step. Concretely, in FIG. 18, the grain boundary was ascertained to be extended in the direction inclined about 15° to 35° relative to the <0001> direction in the GaN single crystal and the starting point of the grain boundary was in the vicinity of the height difference of the step. Meanwhile, the differential interference image observation was performed in the same manner as in Example 1, an etch-pit derived from dislocation was observed, and EPD was determined. FIG. 19 shows an etch-pit observation image at this time. In FIG. 19, no etch-pit was observed in the measurement area and EPD was less than $1 \times 10^4/cm^2$.

Example 6

Figure 20:
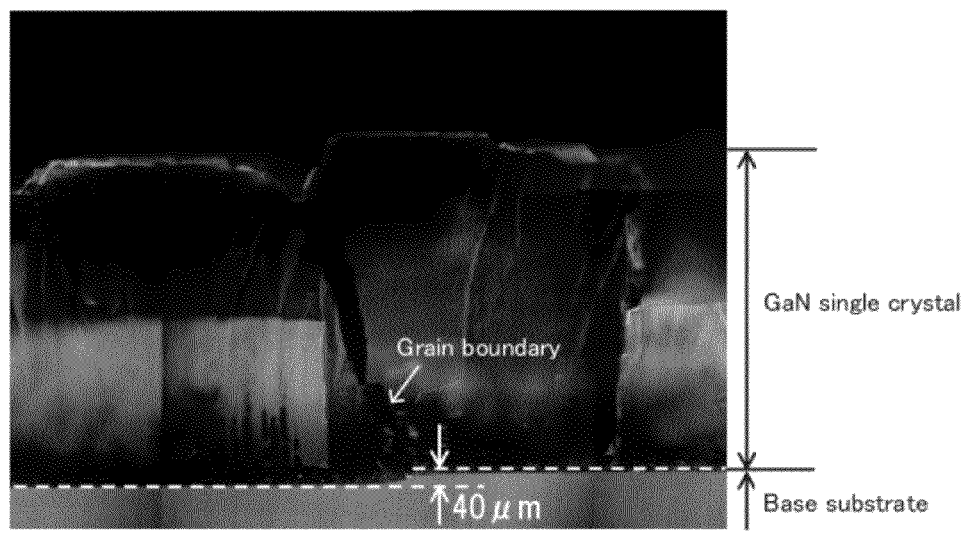
FIG. 20 is a photograph of a fluorescent microscope image of a cross-section of a GaN single crystal in Example 6.
Figure 21:
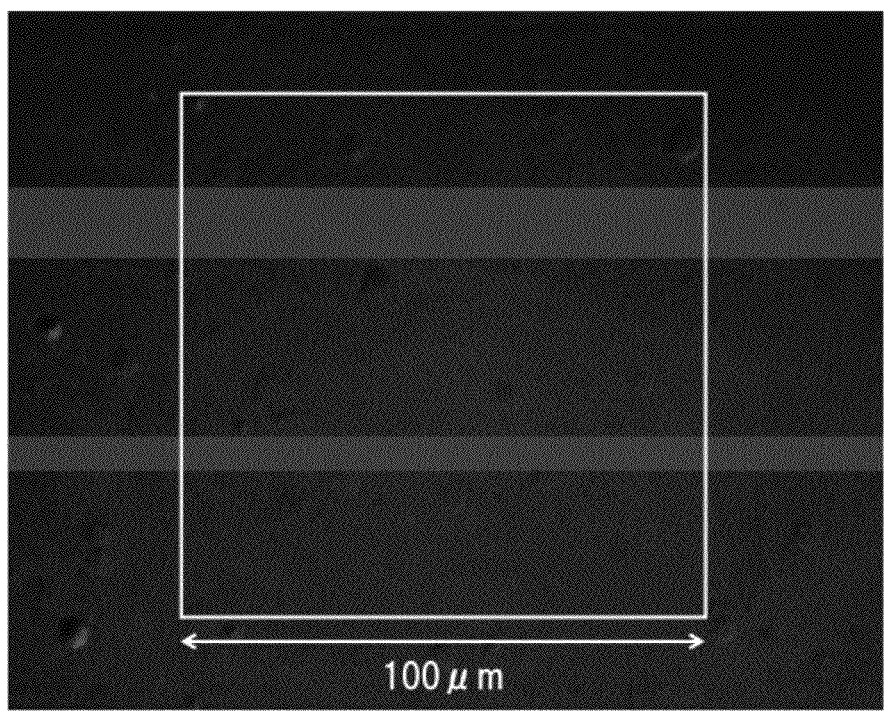
FIG. 21 is a photograph of an etch-pit observation image of a GaN single crystal in Example 6.

A GaN single crystal was grown and recovered from the growth container 12 and a fluorescent microscope image of the recovered GaN crystal was photographed in the same manner as in Example 4 except that the height difference of the step 19 formed on the base substrate 18 was specified to be 40 μm. FIG. 20 shows the fluorescent microscope image at this time. As is clear from FIG. 20, the grain boundary was generated obliquely upward in the GaN single crystal and the starting point of the grain boundary was in the vicinity of the height difference of the step and. Concretely, in FIG. 20, the grain boundary was ascertained to be extended in the direction inclined about 15° to 35° relative to the <0001> direction in the GaN single crystal and the starting point of the grain boundary was in the vicinity of the height difference of the step. Meanwhile, the differential interference image observation was performed in the same manner as in Example 1, an etch-pit derived from dislocation was observed, and EPD was determined. FIG. 21 shows an etch-pit observation image at this time. In FIG. 21, no etch-pit was observed in the measurement area and EPD was less than $1 \times 10^4/cm^2$.

Example 7

A GaN single crystal was grown and recovered from the growth container 12 in the same manner as in Example 4 except that the terrace width of the step 19 formed on the base substrate 18 was specified to be 2 mm. When the recovered GaN crystal was observed with a fluorescent microscope, a grain boundary was generated obliquely upward in the GaN single crystal and starting point of a grain boundary was in the vicinity of the height difference of the step. The grain boundary was extended in the direction inclined about 15° to 35° relative to the <0001> direction in the GaN single crystal and the starting point of the grain boundary was in the vicinity of the height difference of the step. The inclination of the grain boundary relative to the <0001> direction was small as compared with the case of Example 1. Consequently, the thickness of crystal growth 4 times that in Example 1 was required until all over the principal surface was covered up with the grain boundary.

Example 8

A GaN single crystal was grown and recovered from the growth container 12 and a fluorescent microscope image of the recovered GaN crystal was observed in the same manner as in Example 1 except that the height difference of the step 19 formed on the base substrate 18 was specified to be 20 μm, and the growth time was specified to be 150 hours. Consequently, about 1.5 mm of GaN single crystal was grown, and the grain boundary was generated obliquely upward in the GaN single crystal and the starting point of the grain boundary was in the vicinity of the height difference of the step. Concretely, in a cross-section of the GaN crystal cut along the {1-100}, the grain boundary was ascertained to be extended in the direction inclined about 55° to 75° relative to the <0001> direction in the GaN single crystal and the starting point of the grain boundary was in the vicinity of the height difference of the step and to. In the present example, all over the principal surface of the base substrate was covered up with the grain boundary. Meanwhile, the differential interference image observation was performed in the same manner as in Example 1, an etch-pit derived from dislocation was observed, and EPD was determined. No etch-pit was observed in the measurement area and EPD was less than $1 \times 10^4/cm^2$.

Example 9

A GaN single crystal was grown and recovered from the growth container 12 and a fluorescent microscope image of the recovered GaN crystal was observed in the same manner as in Example 1 except that the crystal grown in Example 1 was mirror-polished to expose the {0001} face (c-face), and this was used as the base substrate. Consequently, impurity band light-emission was not ascertained, and no grain boundary (nor inclusion) was generated. Meanwhile, the differential interference image observation was performed in the same manner as in Example 1, an etch-pit derived from dislocation was observed, and EPD was determined. No etch-pit was observed in the measurement area and EPD was less than $1 \times 10^4/cm^2$.

Example 10

Figure 22:
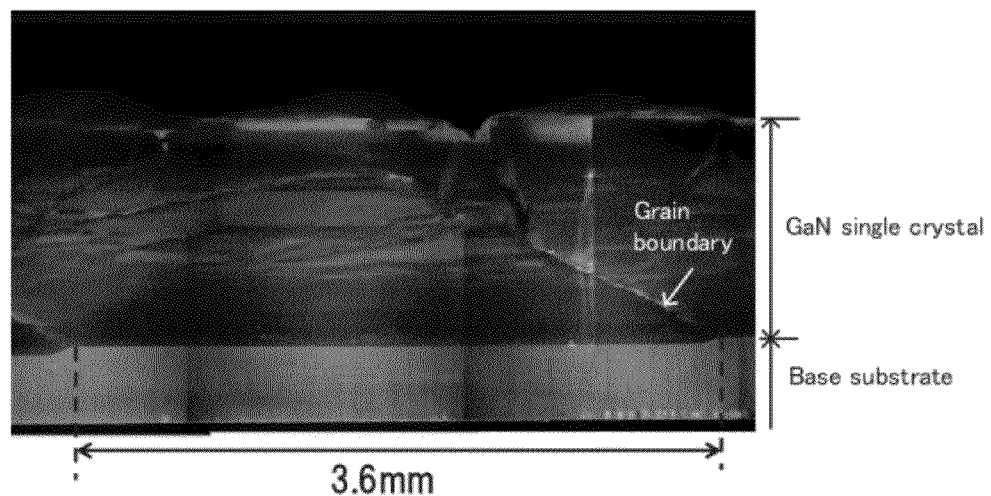
FIG. 22 is a photograph of a fluorescent microscope image of a cross-section of a GaN single crystal in Example 10.
Figure 23:
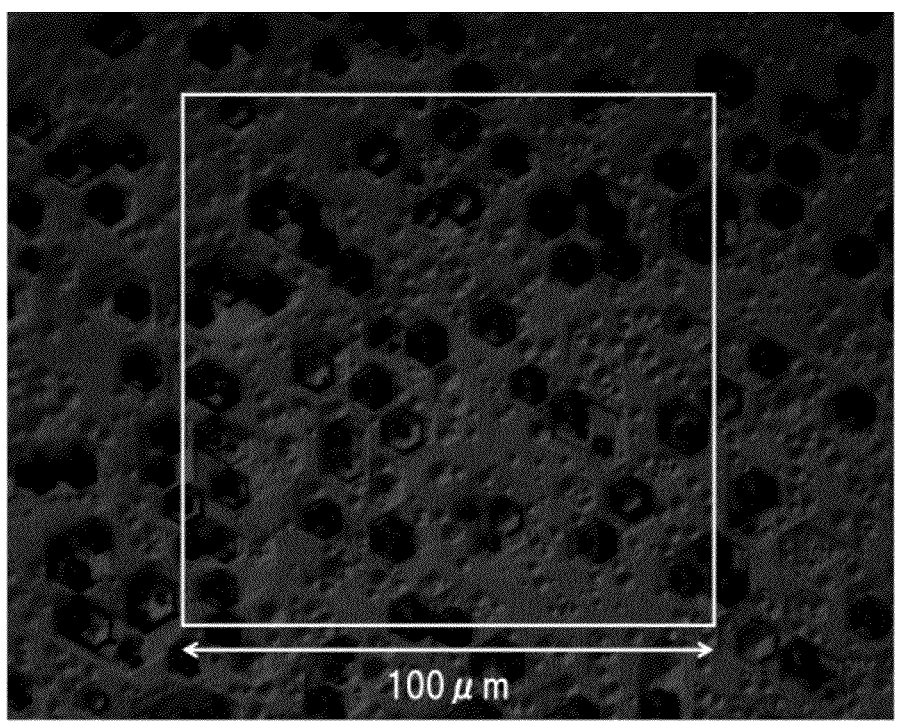
FIG. 23 is a photograph of an etch-pit observation image of a GaN single crystal in Example 10.

A GaN single crystal was grown and recovered from the growth container 12 and a fluorescent microscope image of the recovered GaN crystal was photographed in the same manner as in Example 3 except that the terrace width of the step 19 formed on the base substrate 18 was specified to be 3.6 mm (3,600 μm). FIG. 22 shows the fluorescent microscope image at this time. In FIG. 22, the terrace width was too large and when the GaN single crystal was observed from the surface, there was a place not covered with the grain boundary. The surface of the resulting GaN single crystal was mirror-finished and was immersed in a mixed solution of sulfuric acid and phosphoric acid at 250° C. for about 2 hours, so that an etching treatment was performed. After the etching, among the surface of the GaN single crystal, a place just above the formed grain boundary (or inclusion) was subjected to differential interference image observation through the use of an optical microscope. As a result, no etch-pit derived from dislocation was observed, but as shown in FIG. 23, many etch-pits were observed at places where no grain boundary (nor inclusion) was formed just below the place. The EPD was $3.4 \times 10^6/m^2$. That is, the terrace width was large and, thereby, there were places at which etch-pits were not observed and places at which etch-pits were observed in contrast to Examples 1 to 8.

Example 11

A GaN single crystal was grown and recovered from the growth container 12 and a fluorescent microscope image of the recovered GaN crystal was observed in the same manner as in Example 1 except that the height difference of the step 19 formed on the base substrate 18 was specified to be 50 μm. Consequently, the grain boundary was generated obliquely upward in the GaN single crystal and the starting point of the grain boundary was in the vicinity of the height difference of the step. Concretely, the grain boundary was ascertained to be extended in the direction inclined about 55° to 75° relative to the <0001> direction in the GaN single crystal and the starting point of the grain boundary was in the vicinity of the height difference of the step. In the present example, inclusions were entangled into almost all grain boundaries, and inclusions were exposed at even the GaN crystal surface. Meanwhile, the differential interference image observation was performed in the same manner as in Example 1, an etch-pit derived from dislocation was observed, and EPD was determined. No etch-pit was observed in the measurement area and EPD was less than $1 \times 10^4/cm^2$. That is, in the present example, the height difference was large and, thereby, inclusions were exposed at the surface in contrast to Examples 1 to 8. However, the effect of suppressing etch-pit was obtained sufficiently.

Comparative Example 1

Figure 24:
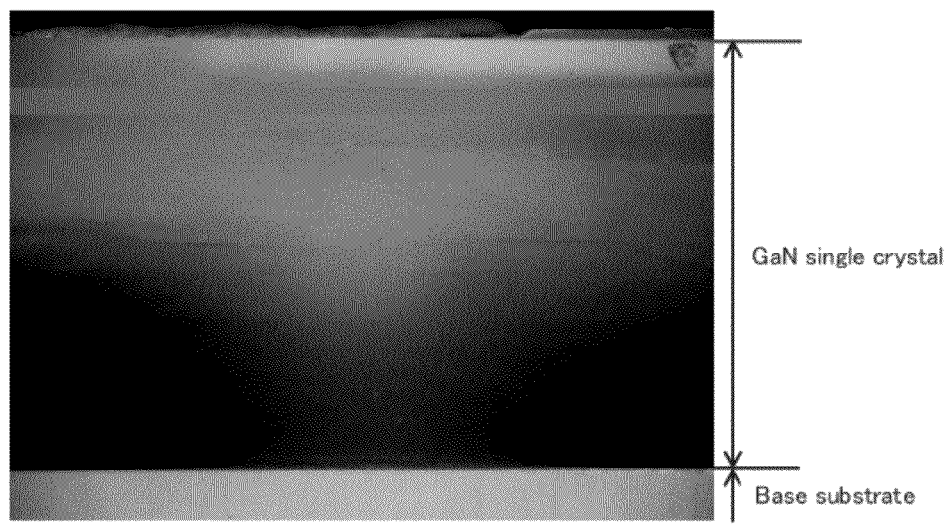
FIG. 24 is a photograph of a fluorescent microscope image of a cross-section of a GaN single crystal in Comparative example 1.
Figure 25:
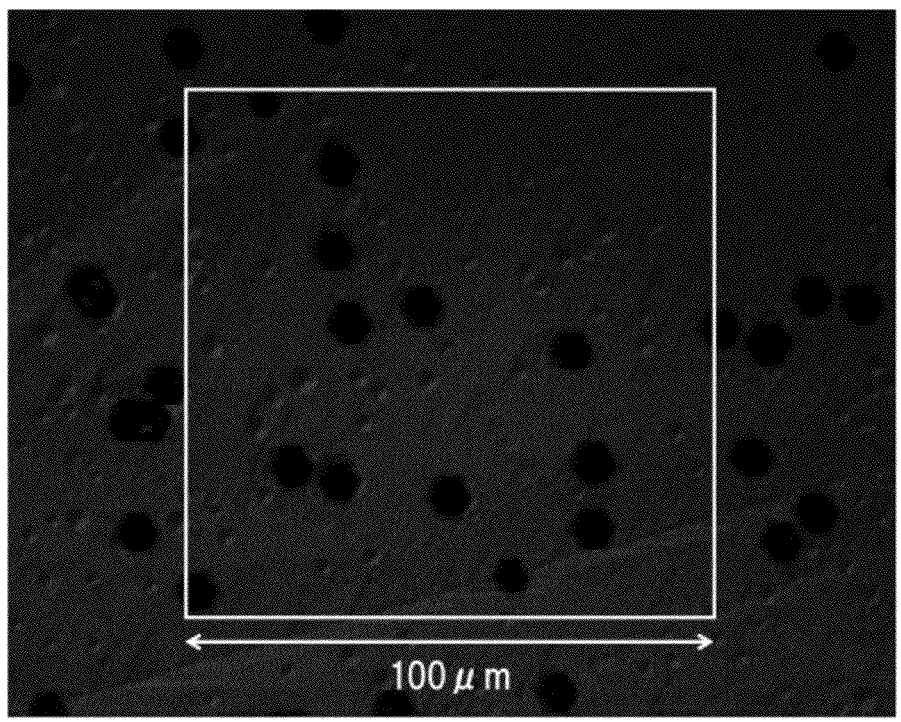
FIG. 25 is a photograph of an etch-pit observation image of a GaN single crystal in Comparative example 1.
Figure 26:
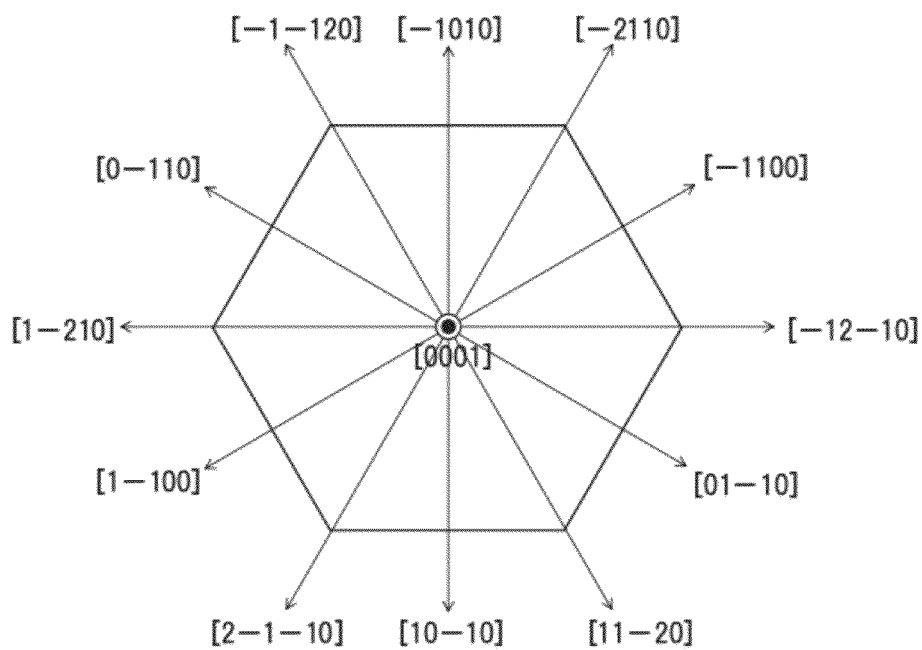
FIG. 26 is an explanatory diagram showing the crystal orientation of a hexagonal crystal.

A GaN single crystal was grown and recovered from the growth container 12 in the same manner as in Example 1 except that a smooth base substrate (base substrate produced without performing the process for forming steps in Example 1) was used. FIG. 24 shows a fluorescent microscope image when light with a wavelength of 330 to 385 nm was applied to a cross-section of the recovered GaN crystal cut along the {11-20}. In FIG. 24, no impurity band light-emission was observed, and no grain boundary was ascertained. Meanwhile, the differential interference image observation was performed at an arbitrary place in the same manner as in Example 1, an etch-pit derived from dislocation was observed, and EPD was determined. FIG. 25 shows an etch-pit observation image at this time. In FIG. 25, many etch-pits were observed in the measurement area and EPD was $7.3 \times 10^5/cm^2$.

Comparative Example 2

A GaN single crystal was grown and recovered from the growth container 12 and a fluorescent microscope image of the recovered GaN crystal was observed in the same manner as in Example 1 except that the height difference of the step 19 formed on the base substrate 18 was specified to be 0.5 μm. Consequently, the 0.5 μm height difference formed on the base substrate was disappeared through meltback before start of growth and, thereby, the surface with substantially no height difference resulted, so that no impurity band light-emission was ascertained, and no grain boundary which starts from in the vicinity of the height difference was generated. Meanwhile, the differential interference image observation was performed in the same manner as in Example 1, an etch-pit derived from dislocation was observed, and EPD was determined. Many etch-pits were observed in the measurement area and EPD was $1.2 \times 10^6/cm^2$.

The present application claims priority from Japanese Patent Application No. 2009-239567 filed on Oct. 16, 2009, the entire contents of which are incorporated in the present specification by reference.

INDUSTRIAL APPLICABILITY

The group 13 nitride crystal produced according to the present invention can be used for high-frequency devices typified by a power amplifier and, in addition, semiconductor devices, e.g., a blue LED, a white LED, and a violet semiconductor laser.

The invention claimed is:

1. A group 13 nitride crystal grown by a flux method on the principal surface of a base substrate comprising a seed crystal layer of a group 13 nitride,
   wherein a principal surface includes a plurality of steps having a height difference on the order of micrometers, said steps formed into a pattern taking on a shape with a concave shape in the center when a vertical cross-section of the base substrate is observed and taking on a point-symmetry figure when the base substrate is observed from the upper surface,
   wherein when a cross-section of the group 13 nitride crystal cut along the {1-100} plane is observed, a grain boundary starts from the height difference of the base substrate and extends obliquely in a direction inclined 55° to 75° relative to the <0001> direction in a single crystal.

2. The group 13 nitride crystal of claim 1, wherein the point-symmetry figure is a point-symmetry polygon.

3. The group 13 nitride crystal of claim 2, wherein the polygon is selected from the group consisting of a tetragon and a hexagon.

4. A group 13 nitride crystal grown by a flux method on the principal surface of a base substrate comprising a seed crystal layer of a group 13 nitride,
   wherein a principal surface includes a plurality of steps having a height difference on the order of micrometers, said steps formed into a pattern taking on a shape with a concave shape in the center when a vertical cross-section of the base substrate is observed and taking on a triangle or a pentagon_when the base substrate is observed from the upper surface,
   wherein when a cross-section of the group 13 nitride crystal cut along the {1-100} plane is observed, a grain boundary starts from the height difference of the base substrate and extends obliquely in a direction inclined 55° to 75° relative to the <0001>direction in a single crystal.

* * * * *